(12) United States Patent
Muraki et al.

(10) Patent No.: US 11,824,532 B2
(45) Date of Patent: Nov. 21, 2023

(54) LEVEL SHIFT CIRCUIT, LIGHT SOURCE, AND IMAGE FORMING APPARATUS

(71) Applicant: CANON KABUSHIKI KAISHA, Tokyo (JP)

(72) Inventors: Taro Muraki, Kanagawa (JP); Naoki Isoda, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 17/954,455

(22) Filed: Sep. 28, 2022

(65) Prior Publication Data
US 2023/0101695 A1     Mar. 30, 2023

(30) Foreign Application Priority Data
Sep. 28, 2021    (JP) ................ 2021-157515

(51) Int. Cl.
| | |
|---|---|
| *H03K 19/0175* | (2006.01) |
| *H03K 19/0185* | (2006.01) |
| *G03G 15/043* | (2006.01) |
| *H03K 3/356* | (2006.01) |
| *G09G 3/34* | (2006.01) |

(52) U.S. Cl.
CPC ... *H03K 19/018521* (2013.01); *G03G 15/043* (2013.01); *G09G 3/34* (2013.01); *H03K 3/356113* (2013.01); *H03K 19/017509* (2013.01)

(58) Field of Classification Search
CPC ....... H03K 19/0175; H03K 19/017509; H03K 19/0185; H03K 19/018507; H03K 19/018514; H03K 19/018521; H03K 19/018528; H03K 3/356113; G03G 15/04; G03G 15/043; G09G 3/34; G09G 3/3406; G09G 3/3433
See application file for complete search history.

(56) References Cited

U.S. PATENT DOCUMENTS

| | | | |
|---|---|---|---|
| 5,087,841 A | 2/1992 | Rogers | |
| 7,348,801 B2 * | 3/2008 | Nojiri | .............. H03K 3/012 |
| | | | 326/68 |

(Continued)

FOREIGN PATENT DOCUMENTS

| | | |
|---|---|---|
| JP | H04-227319 A | 8/1992 |
| JP | 2004-236164 A | 8/2004 |

(Continued)

*Primary Examiner* — Long Nguyen
(74) *Attorney, Agent, or Firm* — Venable LLP (57) ABSTRACT

A level shift circuit includes: a first transistor connected to ground and having a control terminal; a second transistor connected to the ground and having a control terminal connected to the a terminal of the first transistor; a pull-up circuit connected to a power source and also connected to the first terminal of the first transistor, and having a current mirror circuit constituted by two transistors; a third transistor having a first terminal connected to the first terminal of the first transistor, a second terminal connected to the power source, and a control terminal connected to a first terminal of the second transistor; and a fourth transistor having a first terminal connected to the first terminal of the second transistor, a second terminal connected to the power source, and a control terminal connected to the first terminal of the first transistor.

11 Claims, 8 Drawing Sheets

(56) References Cited

U.S. PATENT DOCUMENTS

| | | |
|---|---|---|
| 7,755,411 B2 | 7/2010 | Isoda |
| 8,174,317 B2 | 5/2012 | Isoda |
| 9,712,159 B2 | 7/2017 | Isoda |
| 9,746,865 B2 | 8/2017 | Isoda |
| 9,942,494 B2 | 4/2018 | Isoda |
| 2004/0155693 A1 | 8/2004 | Ito et al. |
| 2006/0208759 A1* | 9/2006 | Nojiri .................... H03K 3/012 326/81 |
| 2017/0019090 A1 | 1/2017 | Honda et al. |

FOREIGN PATENT DOCUMENTS

| | | |
|---|---|---|
| JP | 2008-017456 A | 1/2008 |
| JP | 2017-022599 A | 1/2017 |

* cited by examiner

LEVEL SHIFT CIRCUIT, LIGHT SOURCE, AND IMAGE FORMING APPARATUS

BACKGROUND OF THE INVENTION

Field of the Invention

The present invention relates to a level shift circuit, a light source, and an image forming apparatus.

Description of the Related Art

In case where two logic circuits having different power source voltages are connected to each other, it is necessary to shift a level of a signal output from one of the logic circuits correspondingly to the logic level of the logic circuit on a reception side. In Japanese Patent Application Publication No. 2006-173889, an inverted signal is formed by using a power source voltage with which a logic circuit operates, and logic determination is performed by using an input signal and the inverted signal. There is proposed a level shift circuit which shifts the level of the input signal with the above operation.

However, in Japanese Patent Application Publication No. 2006-173889, in order to shift the level of the input signal, two power source voltages are necessary. That is, in Japanese Patent Application Publication No. 2006-173889, a technique for shifting the level of the input signal with a single power source voltage is not examined.

SUMMARY OF THE INVENTION

To cope with this, an object of the disclosure of the present technique is to provide a technique for shifting the level of an input signal with a single power source voltage.

An aspect of the present technique is a level shift circuit including: a first transistor connected to ground and having a first terminal and a control terminal to which an input signal is input; a second transistor connected to the ground and having a first terminal and a control terminal connected to the first terminal of the first transistor; a pull-up circuit connected to a power source and also connected to the first terminal of the first transistor, and having a current mirror circuit constituted by two transistors; a third transistor having a first terminal connected to the first terminal of the first transistor, a second terminal connected to the power source, and a control terminal connected to the first terminal of the second transistor; and a fourth transistor having a first terminal connected to the first terminal of the second transistor, a second terminal connected to the power source, and a control terminal connected to the first terminal of the first transistor.

Further features of the present invention will become apparent from the following description of exemplary embodiments with reference to the attached drawings.

DESCRIPTION OF THE EMBODIMENTS

Hereinafter, individual embodiments will be described with reference to the drawings. Note that each of the following embodiments is only an example, and numerical values, shapes, materials, components, and placement and connection modes of the components are not intended to limit the present embodiments. Note that, when components are designated by the same reference numeral in a plurality of the drawings, the components are identical to each other in the individual drawings.

Embodiment 1

Figure 1:
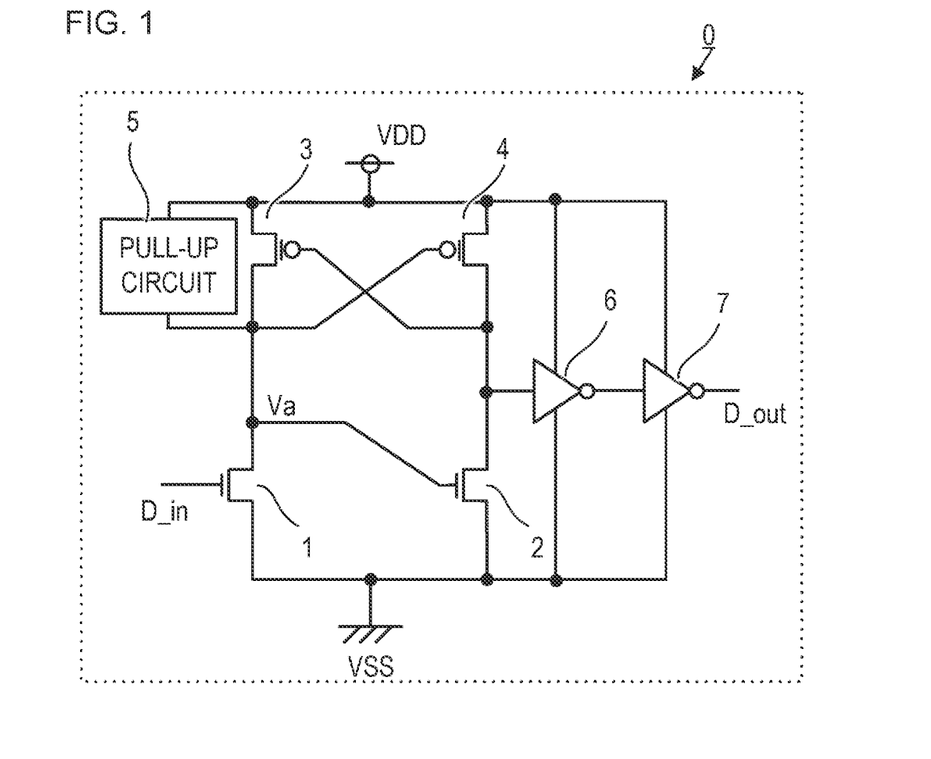
FIG. 1 is a circuit diagram of a level shift circuit according to Embodiment 1.

FIG. 1 shows an example of a level shift circuit 0. The level shift circuit 0 has a first transistor 1, a second transistor 2, a third transistor 3, a fourth transistor 4, a pull-up circuit 5, an inverter 6, and an inverter 7. The level shift circuit 0 shifts the level of an input signal D_in using a power source voltage VDD (power source potential) and outputs the input signal D_in as an output signal D_out.

To a gate terminal (control terminal) of the first transistor 1, the input signal (external signal) D_in is input. To a drain terminal of the first transistor 1, a gate terminal of the second transistor 2 is electrically connected. A source terminal of the first transistor 1 and a source terminal of the second transistor 2 are connected to ground (earth; voltage VSS) (grounded). Herein, each of the first transistor 1 and the second transistor 2 is an NMOS transistor (hereinafter simply described as NMOS).

The third transistor 3 and the fourth transistor 4 constitute a circuit which determines logic. A drain terminal of the third transistor 3 is electrically connected to a gate terminal of the fourth transistor 4 and the drain terminal of the first transistor 1. On the other hand, a drain terminal of the fourth transistor 4 is electrically connected to a gate terminal of the third transistor 3 and a drain terminal of the second transistor 2. That is, the gate terminal of the third transistor 3 is electrically connected to the drain terminal of the second transistor 2, and the gate terminal of the fourth transistor 4 is electrically connected to the drain terminal of the first transistor 1. A source terminal of the third transistor 3 and a source terminal of the fourth transistor 4 are connected to a power source (voltage source; power source voltage VDD). Herein, each of the third transistor 3 and the fourth transistor 4 is a PMOS transistor (hereinafter simply described as PMOS).

Each transistor described above does not need to be constituted by a metal-oxide-semiconductor field-effect transistor (MOS). Each transistor may be constituted by a bipolar junction transistor (BJP). "electrically connected" includes a case where elements such as a switch and a resistor which control operations are sandwiched between two transistors.

The level of the input signal D_in is shifted by these transistors, the input signal D_in further passes through the inverter 6 and the inverter 7, and is output as the output signal D_out. Note that the level shift circuit 0 does not need to have two inverters 6 and 7, and the level shift circuit 0 does not need to have any inverter. In addition, the level shift circuit 0 may have a single invertor or have three or more inverters.

Figure 2:
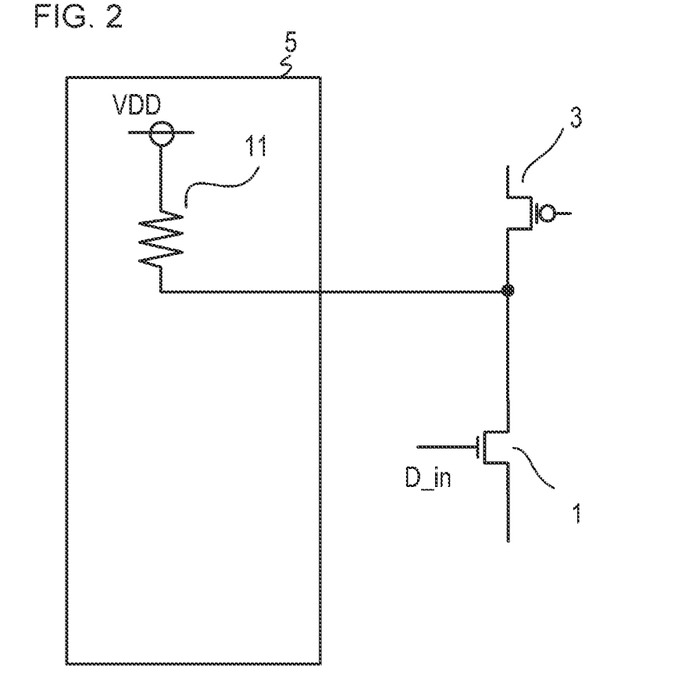
FIG. 2 is a circuit diagram of a pull-up circuit according to Embodiment 1.

The pull-up circuit 5 is a circuit which applies a voltage for pulling up the level of a voltage Va of the drain terminal of the first transistor 1 to "H" when the first transistor 1 changes from an ON state to an OFF state. The pull-up circuit 5 is electrically connected to the power source (voltage source), the third transistor 3 (the source terminal and the drain terminal of the third transistor 3), and the drain terminal of the first transistor 1. As shown in FIG. 2, the pull-up circuit 5 has, e.g., a pull-up resistor 11. Note that the amount of current which flows to the first transistor 1 in case where the first transistor 1 is in the ON state is different from the amount of current which flows to the second transistor 2 in case where the second transistor 2 is in the ON state due to the presence of the pull-up circuit 5.

Figure 3:
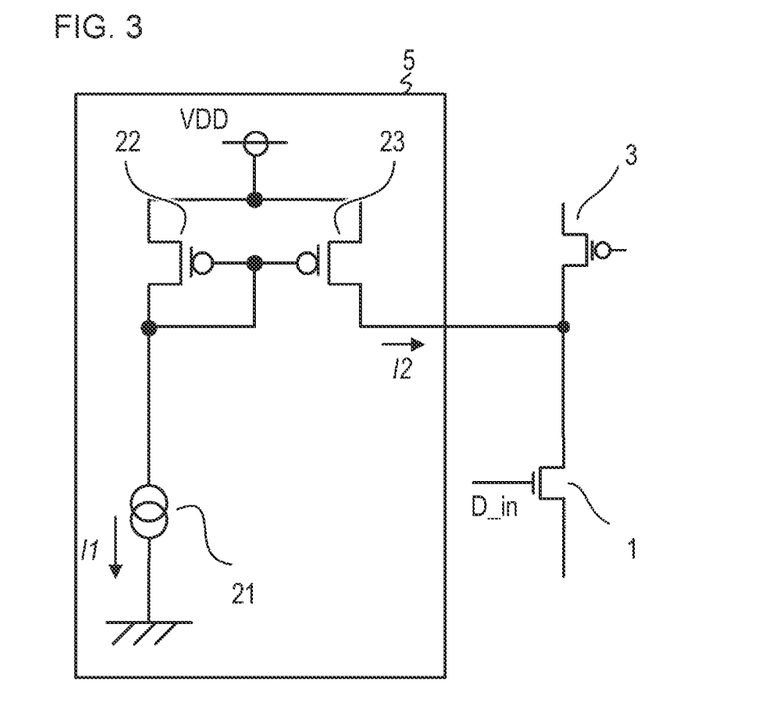
FIG. 3 is a circuit diagram of the pull-up circuit according to Embodiment 1.

Alternatively, for example, as shown in FIG. 3, the pull-up circuit 5 may have, together with a constant current source 21, two transistors (a transistor 22, a transistor 23) which constitute a current mirror circuit of a constant current of the constant current source 21. At this point, when the transistor 22 and the transistor 23 have the same size, a current I1 of the constant current source 21 is copied as a current I2 which flows in wiring which connects to the third transistor 3 and the first transistor 1 from the pull-up circuit 5. On the other hand, when the size of the transistor 22 is S1 and the size of the transistor 23 is S2, a ratio between the current I1 and the current I2 can be set as S1:S2. Accordingly, in order to suppress overall current consumption in the pull-up circuit 5, the size of the transistor 23 electrically connected to the drain terminal of the first transistor 1 is preferably larger than the size of the transistor 22 (the other transistor).

Figure 4:
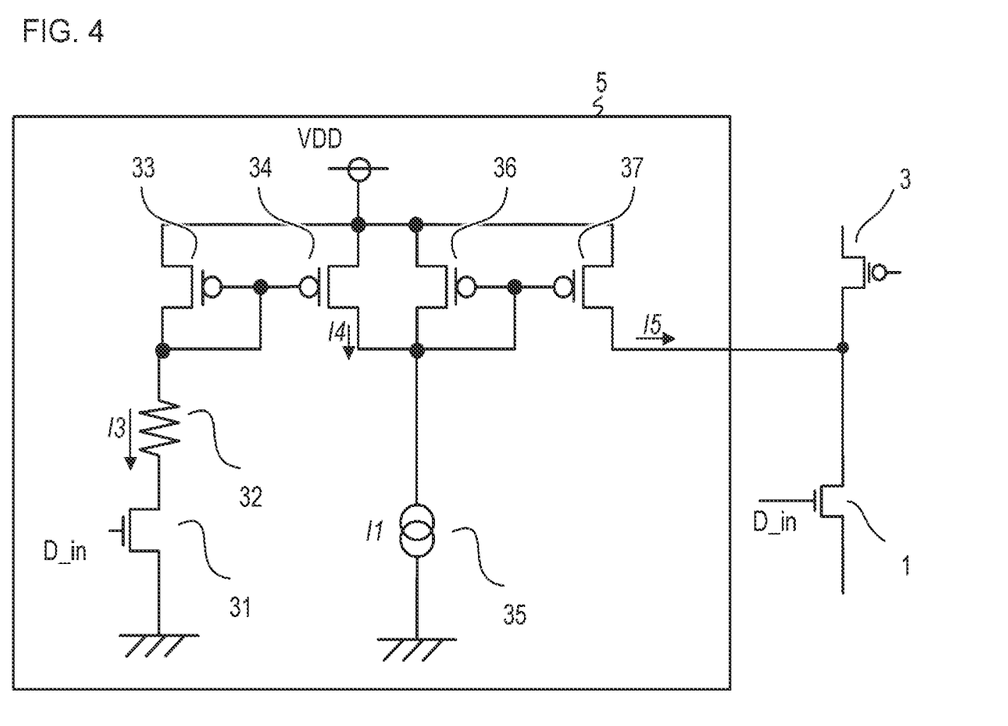
FIG. 4 is a circuit diagram of the pull-up circuit according to Embodiment 1.

Alternatively, as shown in FIG. 4, the pull-up circuit 5 may have two transistors (a transistor 33 and a transistor 34) which constitute a current mirror circuit of a current flowing to a resistor 32 by using a transistor 31 to which the input signal D_in is input. In an example in FIG. 4, the pull-up circuit 5 further has a constant current source 35, and two transistors (a transistor 36, a transistor 37) which constitute a current mirror circuit of a constant current of the constant current source 35.

First, it is assumed that each of a size ratio between the transistor 33 and the transistor 34 and a size ratio between the transistor 36 and the transistor 37 is 1:1. At this point, when a current I3 flowing to the resistor 32 increases, a current I4 which flows from the transistor 34 constituting the current mirror circuit to the constant current source 35 also increases. The current I4 flows into the constant current source 35 (the constant current source of the current I1) and hence, when the current I4 increases, a current I1-I4 flowing to the transistor 36 decreases. Consequently, a current I5 (=I1-I4) which is output from the transistor 37 constituting the current mirror circuit to the third transistor 3 and the first transistor 1 also decreases.

Herein, when the input signal D_in is "H", the transistor 31 is in the ON state, and hence the current I3 flowing in the resistor 32 increases to a level higher than that in case where the input signal D_in is "L" (a current flowing in the resistor 32 is generated). According to the above description, the current I5 decreases as the current I3 increases. That is, the pull-up circuit 5 can control the amount of current flowing to the outside from the pull-up circuit 5. Specifically, the pull-up circuit 5 can perform control so as to suppress unnecessary current which flows to the outside from the pull-up circuit 5 in case where the input signal D_in is "H".

In addition, similarly to an example in FIG. 3, also in the example in FIG. 4, the size of the transistor 36 is preferably smaller than the size of the transistor 37 in order to suppress current consumption. For example, a gate width of the transistor 36 is preferably smaller than a gate width of the transistor 37. According to this, even in case where the current I5 having a large value is necessary, it is possible to decrease the current I1 and the current I3, and hence it is possible to suppress overall current consumption in the pull-up circuit 5. Note that the configuration of the pull-up circuit 5 shown in each of FIGS. 2 to 4 is only an example, and the configuration of the pull-up circuit 5 is not limited to the above configuration.

Figure 5:
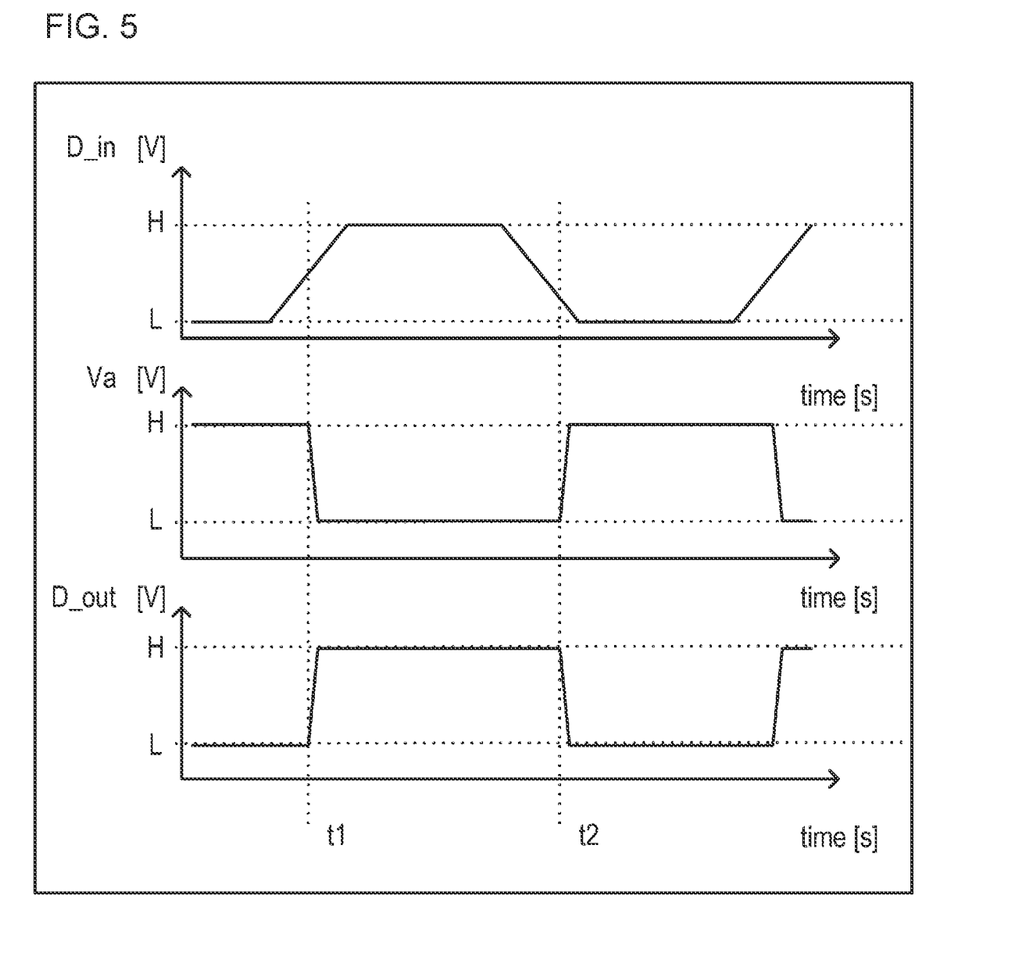
FIG. 5 is a view for explaining the operation of the level shift circuit according to Embodiment 1.

(With Regard to Operation of Level Shift Circuit) The operation of the level shift circuit 0 in the present embodiment will be described with reference to FIG. 5.

When the input signal D_in (the level of the voltage of the input signal Din) changes to "H", the first transistor 1 pulls down the level of the voltage Va to "L". Note that the voltage Va is a drain voltage of the first transistor 1 and is also a gate voltage of the second transistor 2. With this, the second transistor 2 changes to the OFF state, and the fourth transistor 4 changes to the ON state. In addition, the level of a gate voltage of the third transistor 3 changes to "H", and hence the third transistor 3 changes to the OFF state. As a result, the level shift circuit 0 is brought into a state in which the output signal D_out (the level of the voltage of the output signal D_out) is maintained at "H" (latched state).

On the other hand, when the input signal D_in changes to "L", the first transistor 1 is in the OFF state, and hence the level of the voltage Va which is the gate voltage of the second transistor 2 is pulled up to "H" by the pull-up circuit 5. Subsequently, when the voltage Va exceeds a threshold value, the second transistor 2 changes to the ON state. In addition, when the voltage Va is pulled up, the fourth transistor 4 changes to the OFF state. With this, the gate voltage of the third transistor 3 changes to "L", and hence the third transistor 3 changes to the ON state. As a result, a state in which the output signal D_out (the level of the voltage of the output signal D_out) is maintained at "L" (latched state) is established.

With the foregoing, the level shift circuit 0 can change to the latched state without generating (forming) an inverted signal which uses a plurality of power source voltages. In addition, a configuration for generating a plurality of power source voltages and a configuration for generating the inverted signal become unnecessary, and hence it becomes possible to reduce the size of the entire circuit for shifting the level.

Figure 6:
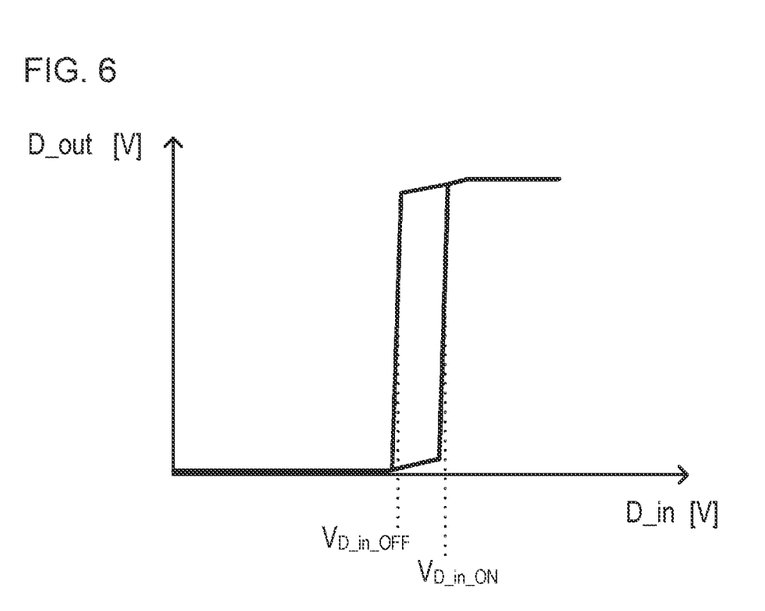
FIG. 6 is a graph showing a relationship between an input signal and an output signal according to Embodiment 1.

(With Regard to Accompanying Effect) In addition, an accompanying effect associated with the configuration in FIG. 1 will be described with reference to FIG. 6. FIG. 6 shows an example of a voltage relationship between the input signal D_in and the output signal D_out of the level shift circuit 0 in a certain design value. Note that, herein, a case is assumed in which the size of the first transistor 1 and the size of the second transistor 2 are identical to each other, and the size of the third transistor 3 and the size of the fourth transistor 4 are identical to each other.

First, in case where the first transistor 1 is brought into the ON state from the OFF state, it is necessary to apply a gate voltage for pulling down the amount of current caused to flow by the operation of the third transistor 3 in the ON state and the amount of current flowing from the pull-up circuit 5 to the first transistor 1. Accordingly, a voltage $V_{D\_in\_ON}$ of the input signal D_in serving as a threshold value when the output signal D_out switches from "L" to "H" is relatively high.

On the other hand, in case where the first transistor 1 is brought into the OFF state from the ON state, the third transistor 3 is in the OFF state. Accordingly, it is necessary to apply a gate voltage which reduces the current capability of the first transistor 1 to a level lower than the level of the current capability of the amount of current flowing from the pull-up circuit 5 to the first transistor 1. Consequently, as shown in FIG. 6, as compared with the voltage $V_{D\_in\_ON}$, a voltage $V_{D\_in\_OFF}$ of the input signal D_in serving as a threshold value when the output signal D_out switches from "H" to "L" is low.

Specifically, the voltages $V_{D\_in\_ON}$ and $V_{D\_in\_OFF}$ are based on Formula 1 and Formula 2 shown below. Herein, it is assumed that the amount of a pull-up current flowing from the pull-up circuit 5 is Ipull, and a MOS operates in a saturation region. Further, it is assumed that the mobility of a PMOS is μp, the mobility of an NMOS is μn, the thickness of an oxide film of the PMOS is Coxp, and the thickness of an oxide film of the NMOS is Coxn. In addition, it is assumed that a W/L width of the PMOS is Wp/Lp, a W/L width of the NMOS is Wn/Ln, a threshold voltage of the PMOS is Vthp, and a threshold voltage of the NMOS is Vthn. Note that Formula 1 is a formula which is satisfied when the output signal D_out changes from "L" to "H", and Formula 2 is a formula which is satisfied when the output signal D_out changes from "H" to "L".

$$Ipull + \frac{1}{2}\mu pCoxp\frac{Wp}{Lp}(VDD - Vthp)^2 = \frac{1}{2}\mu nCoxn\frac{Wn}{Ln}(V_{D\_in\_ON} - Vthn)^2 \quad (1)$$

$$Ipull = \frac{1}{2}\mu nCoxn\frac{Wn}{Ln}(V_{D\_in\_OFF} - Vthn)^2 \quad (2)$$

Formula 3 is satisfied by modifying Formula 1, and Formula 4 is satisfied by modifying Formula 2.

$$V_{D\_in\_ON} = \sqrt{\frac{2Ipull}{\mu nCoxn\frac{Wn}{Ln}} + \frac{\mu pCoxp\frac{Wp}{Lp}}{\mu nCoxn\frac{Wn}{Ln}}(VDD - Vthp)^2} + Vthn \quad (3)$$

$$V_{D\_in\_OFF} = \sqrt{\frac{2Ipull}{\mu nCoxn\frac{Wn}{Ln}}} + Vthn \quad (4)$$

With Formula 3 and Formula 4, it is possible to set the threshold values of the voltage of the input signal D_in (voltages $V_{D\_in\_ON}$ and $V_{D\_in\_OFF}$) for switching the state of the output signal D_out, and a hysteresis width is determined by determining a difference therebetween. That is, it is possible to determine the threshold values of the voltage and the hysteresis width according to the capability of the pull-up circuit 5. According to this, even when a phenomenon (chattering) in which the voltage of the input signal D_in changes minutely in a narrow range has occurred, it is possible to prevent the state of the output signal D_out from changing. That is, it is possible to prevent the output signal D_out in a wrong state from being output.

In addition, when the size of each transistor changes, the values of Wp/Lp and Wn/Ln in Formula 3 and Formula 4 change, and hence the values of the voltage $V_{D\_in\_ON}$ and the voltage $V_{D\_in\_OFF}$ change. Consequently, it is possible to change the hysteresis width also by changing the size of the first transistor 1 and the size of the second transistor 2, or changing the size of the third transistor 3 and the size of the fourth transistor 4.

Embodiment 2

Figure 7:
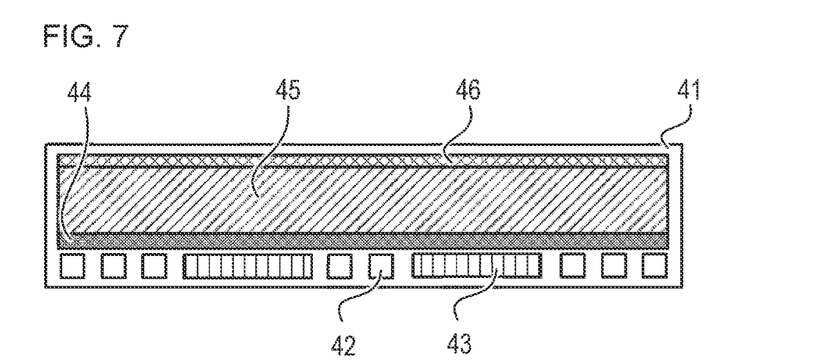
FIG. 7 is a configuration diagram of a solid exposure light source according to Embodiment 2.

With reference to FIG. 7, as Embodiment 2, a description will be given of a solid exposure light source IC to which the level shift circuit 0 according to Embodiment 1 is applied. The solid exposure light source IC is used as, e.g., a light source for development of an electrophotograph of a copier.

In the solid exposure light source IC, a chip 41 has a pad section 42 which includes an input/output circuit serving as an interface for external connection, a logic block 43 which controls the operation of the solid exposure light source IC, a horizontal scanning circuit 44, a pixel region 45, and a pixel drive block 46.

A plurality of pixels are disposed in the pixel region 45. Each of the plurality of pixels typically includes an LED light-emitting element. The LED light-emitting element is, e.g., an organic EL element.

Herein, for example, an input signal which has a high propagation speed and is generated at 3.3 V which is a low voltage is input to the pad section 42 including the input/output circuit, and is further transmitted to the logic block 43. In addition, a control signal output from the logic block 43 selects a pixel which is driven in the pixel region 45 via the horizontal scanning circuit 44, and causes the pixel to emit light using the pixel drive block 46. On the other hand, in order to drive the pixel, a high withstand voltage element which can withstand, e.g., a voltage exceeding 5.0 V is necessary. Accordingly, all internal portions of circuits of the logic block 43, the horizontal scanning circuit 44, the pixel region 45, and the pixel drive block 46 are designed so as to operate at 5.0 V.

Therefore, at an interface between the pad section 42 which receives the input signal having the low voltage and the logic block 43 which operates at the high voltage, the level shift circuit which shifts the level of the input signal is necessary. Accordingly, the circuit of each of the logic block 43, the horizontal scanning circuit 44, the pixel region 45, and the pixel drive block 46 can operate with an output signal having a high voltage obtained by shifting the level of the input signal.

(Necessity for Level Shift Circuit by Single Power Source) In the solid exposure light source IC, from the viewpoint of reliability (resistance to water) of the pixel region 45, it is necessary to keep the pixel region 45 away from an end portion of the chip 41 and a pad of the pad section 42 by a predetermined distance. Further, from the viewpoint of chip cost, it is desirable to dispose the pad section 42 on one side of the chip. Consequently, the number of disposed pads in the pad section 42, and an element region in which the pad can be disposed are restricted. Under such a restriction, when a plurality of power sources (a plurality of power source voltages) for level shift are used, chip size is increased.

On the other hand, as in the present embodiment, when the level shift circuit 0 according to Embodiment 1 which uses only the single power source is used, it is possible to solve a problem in which the chip size is increased.

In addition, in case where the solid exposure light source IC serving as a light source for development of an electrophotograph of a copier is used, a length-to-width aspect ratio of the chip 41 is increased. For example, in the solid exposure light source IC, the length-to-width aspect ratio of the chip 41 is about a ratio of length:width=1:200. Additionally, from the view point of the chip cost, a wiring layer is also restricted, and hence, in order to adequately reduce a power source impedance, it is desirable to operate the chip with a single power source (voltage source) and allocate wiring to the single power source. To cope with this, by using the level shift circuit 0 according to Embodiment 1, it is also possible to adequately reduce the power source impedance.

Embodiment 3

Figure 8A:
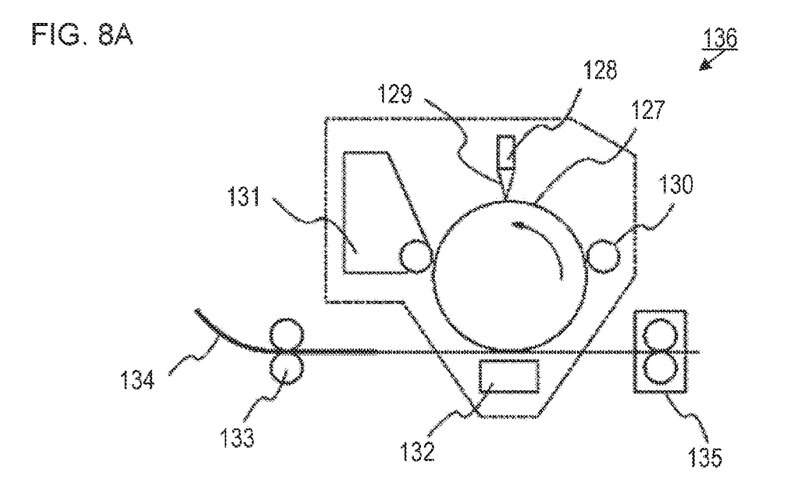
FIGS. 8A to 8C are schematic views of an image forming apparatus according to Embodiment 3.

FIG. 8A is a schematic view of an image forming apparatus 136 according to Embodiment 3. The image forming apparatus 136 has a photosensitive member 127, an exposure light source 128, a charging member 130, a developing member 131, a transfer unit 132, a transport member 133 (transport roller), and a fixing unit 135.

Light 129 is emitted from the exposure light source 128, and an image (electrostatic latent image) is formed on a surface of the photosensitive member 127. The exposure light source 128 has the solid exposure light source IC according to Embodiment 2. The developing member 131 has toner or the like. The charging member 130 charges the photosensitive member 127. The transfer unit 132 transfers the image (electrostatic latent image) developed on the photosensitive member 127 to a recording medium 134. The transport member 133 transports the recording medium 134. The recording medium 134 is, e.g., paper. The fixing unit 135 fixes an image formed on the recording medium 134.

Figure 8B:
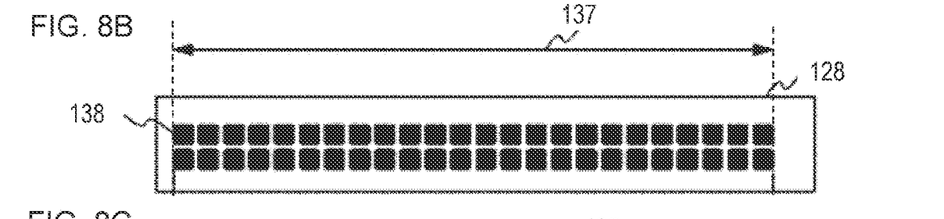
Figure 8C:
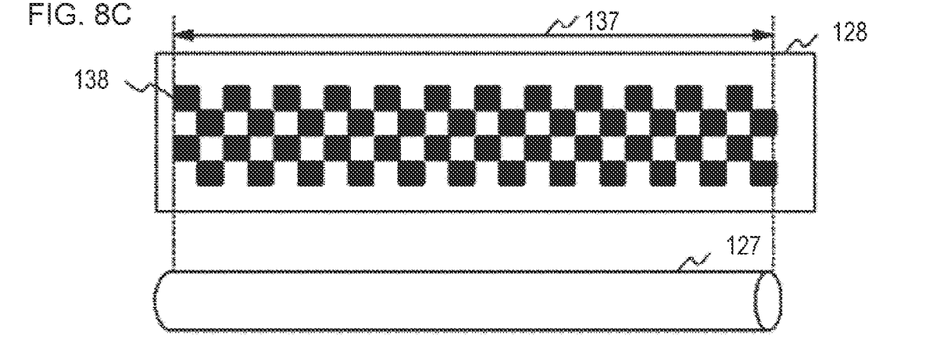

Each of FIGS. 8B and 8C is a schematic view showing a state in which a plurality of light-emitting members 138 are disposed on a long substrate in the exposure light source 128. A direction 137 is a direction parallel to the axis of the photosensitive member 127, and represents a column direction in which the light-emitting members 138 are arranged. The column direction is identical to the direction of an axis about which the photosensitive member 127 rotates. This direction can also be referred to as a major axis direction of the photosensitive member 127.

FIG. 8B shows a form in which the light-emitting members 138 are disposed along the major axis direction of the photosensitive member 127. FIG. 8C shows a form different from that of FIG. 8B and, in the form, the light-emitting members 138 are disposed alternately in the column direction in each of first and second columns. The first column and the second column are disposed at positions which are different in a row direction.

In the first column, a plurality of the light-emitting members 138 are disposed at intervals. The second column has the light-emitting members at positions corresponding to the intervals between the light-emitting members 138 in the first column. That is, also in the row direction, a plurality of the light-emitting members 138 are disposed at intervals.

The placement in FIG. 8C can also be rephrased as a state in which the light-emitting members 138 are disposed in, e.g., a lattice shape (a state in which the light-emitting members 138 are disposed in a houndstooth shape or checkered pattern).

According to the disclosure of the present technique, it is possible to shift the level of the input signal with the single power source voltage.

OTHER EMBODIMENTS

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2021-157515, filed on Sep. 28, 2021, which is hereby incorporated by reference herein in its entirety.

What is claimed is:

1. A level shift circuit comprising:
   a first transistor connected to ground and having a first terminal and a control terminal to which an input signal is input;
   a second transistor connected to the ground and having a first terminal and a control terminal connected to the first terminal of the first transistor;
   a pull-up circuit connected to a power source and also connected to the first terminal of the first transistor, and having a current mirror circuit constituted by two transistors;
   a third transistor having a first terminal connected to the first terminal of the first transistor, a second terminal connected to the power source, and a control terminal connected to the first terminal of the second transistor; and
   a fourth transistor having a first terminal connected to the first terminal of the second transistor, a second terminal connected to the power source, and a control terminal connected to the first terminal of the first transistor.

2. The level shift circuit according to claim 1, wherein
   each of the first transistor and the second transistor is an NMOS transistor,
   each of the third transistor and the fourth transistor is a PMOS transistor,
   the first terminal of each of the first transistor, the second transistor, the third transistor and fourth transistor is a drain terminal,
   the second terminal of each of the third transistor and fourth transistor is a source terminal, and
   the control terminal of each of the first transistor, the second transistor, the third transistor and fourth transistor is a gate terminal.

3. The level shift circuit according to claim 1, wherein the pull-up circuit has a resistor.

4. The level shift circuit according to claim 1, wherein
   one of the two transistors constituting the current mirror circuit is connected to the first terminal of the first transistor, and
   a size of the transistor connected to the first terminal of the first transistor is larger than a size of another transistor.

5. The level shift circuit according to claim 1, wherein
   the input signal is input to the pull-up circuit, and
   the pull-up circuit controls an amount of current flowing from the pull-up circuit according to a state of the input signal.

6. The level shift circuit according to claim 1, wherein
   the level shift circuit shifts a level of the input signal and outputs the input signal as an output signal, and
   a first threshold value of a voltage of the input signal at which a state of the output signal switches from a first state to a second state is different from a second threshold value of the voltage of the input signal at which the state of the output signal switches from the second state to the first state.

7. The level shift circuit according to claim 6, wherein a difference between the first threshold value and the second threshold value changes in case where a size of the third transistor and a size of the fourth transistor change.

8. The level shift circuit according to claim 6, wherein a difference between the first threshold value and the second threshold value changes in case where a size of the first transistor and a size of the second transistor change.

9. The level shift circuit according to claim 1, wherein an inverted signal of the input signal is not used.

10. A light source comprising:
    the level shift circuit according to claim 1;
    a pad section which receives the input signal; and
    a logic block which controls an operation of the light source using a signal obtained by shifting a level of the input signal with the level shift circuit.

11. An image forming apparatus comprising:
    an exposure light source which has the light source according to claim 10; and
    a photosensitive member which forms an image on a surface with light emitted from the exposure light source.

* * * * *